United States Patent
Kiefer et al.

(10) Patent No.: US 7,050,617 B2
(45) Date of Patent: May 23, 2006

(54) METHOD FOR HOMOGENIZING THE IMAGING PRODUCED FROM A MAGNETIC RESONANCE MEASUREMENT

(75) Inventors: Berthold Kiefer, Erlangen (DE); Jianmin Wang, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 560 days.

(21) Appl. No.: 10/213,733

(22) Filed: Aug. 7, 2002

(65) Prior Publication Data
US 2003/0035574 A1 Feb. 20, 2003

(30) Foreign Application Priority Data
Aug. 7, 2001 (DE) .................. 101 38 705

(51) Int. Cl.
*G06K 9/00* (2006.01)
(52) U.S. Cl. .................. 382/131; 324/307; 600/410
(58) Field of Classification Search ............... 382/128, 382/129, 13, 131, 132, 133, 134, 130; 324/300, 324/306, 307, 309, 312, 314, 318, 322, 327; 600/13, 410, 412, 422
See application file for complete search history.

(56) References Cited

U.S. PATENT DOCUMENTS

| 4,694,254 A | * | 9/1987 | Vatis et al. .................. 324/309 |
| 5,284,144 A | * | 2/1994 | Delannoy et al. ............. 600/412 |
| 5,712,567 A | * | 1/1998 | Wang .......................... 324/307 |
| 5,821,751 A | * | 10/1998 | Wendt et al. ................ 324/307 |
| 6,556,010 B1 | * | 4/2003 | Van Den Brink et al. .. 324/309 |

* cited by examiner

*Primary Examiner*—Jingge Wu
*Assistant Examiner*—Abolfazl Tabatabai
(74) *Attorney, Agent, or Firm*—Schiff Hardin LLP

(57) ABSTRACT

In a method for homogenizing the imaging obtained by a magnetic resonance measurement of a body region, wherein a local antenna of small dimensions and an antenna arrangement arranged outside the body and of larger dimensions are used for imaging, in order to obtain a combined image, a reception profile, referenced to the reception profile of the antenna arrangement of the local antenna, is determined, and the combined image is corrected with the aid of this relative reception profile of the local antenna. A homogenized combined magnetic resonance image is obtained without reducing the signal-to-noise ratio that can be achieved by the local antenna.

8 Claims, 3 Drawing Sheets

METHOD FOR HOMOGENIZING THE IMAGING PRODUCED FROM A MAGNETIC RESONANCE MEASUREMENT

BACKGROUND OF THE INVENTION

1. Field of the Invention

The present invention relates to a method for homogenizing the imaging of a body region produced from a magnetic resonance measurement, in particular a body region produced by signals from a local antenna of small dimensions, such as an endorectal coil, and an antenna arrangement that is arranged outside the body and that has larger dimensions than the local antenna, such as a body array antenna, in order to obtain a combined image having pixels that are formed from first signal amplitudes received by coil elements of the antenna arrangements and second signal amplitudes received by the local antenna.

2. Description of the Prior Art

Magnetic resonance tomography is a known technique for obtaining images of the interior of the body of a living object under examination. In order to carry out magnetic resonance tomography, a basic field magnetic generates a static relatively homogeneous basic magnetic field. During the recording of magnetic resonance images, rapidly switched gradient fields for spatial coding, which are generated by gradient coils, are superimposed on this basic magnetic field. Radio-frequency transmitting antennas are used to irradiate radio-frequency pulses into the object under examination in order to trigger magnetic resonance signals. The magnetic resonance signals caused by these Radio-frequency pulses are picked up by radio-frequency receiving antennas. The magnetic resonance images of the examined region of the object under examination are constructed up on the basis of these magnetic resonance signals received by the receiving antennas. Each pixel in the magnetic resonance image is assigned to a small body volume in this case. The brightness or intensity value of the pixel is dependent on the signal amplitude, received from this body volume, of the magnetic resonance signal. Whole-body radio-frequency antennas, surface antennas, in particular, local antennas of small dimensions that can be inserted into the body can be used as receiving and/or transmitting antennas. The local antennas that can be inserted into the body—as a rule via a catheter—receive the magnetic resonance signals from a comparatively small body region. Just like surface antennas, such local antennas have the advantage by comparison with whole-body radio-frequency antennas of a better signal-to-noise ratio. The signal-to-noise ratio of the local antennas that can be inserted into the body, in turn is substantially higher than that of a surface antenna, owing to their small dimensions. However, the sensitivity of such a local antenna is strongly inhomogeneous over the measuring volume. The intensity of the received signal decreases with the distance from the signal source, i.e., the atomic nuclei emitting the magnetic resonance signals. This is manifested in the magnetic resonance images by regions of the measuring volume that are situated near the local antennas appearing with a higher intensity than regions that are situated further away.

Because of its high signal-to-noise ratio, an endorectal coil is frequently used as local antenna in prostate examinations. An endorectal coil can be inserted directly into the body of the person to be examined and brought to the appropriate measuring point. Although a high signal-to-noise ratio is obtained in the vicinity of the prostate with the endorectal coil, the depth of penetration of the coil with regard to the reception sensitivity is limited to approximately the size of the coil. Consequently, in the case of such measurements, simultaneous use is made of a surface antenna that is formed from a number of coil elements and is a so-called body array coil or body array antenna, in order also to irradiate the surrounding tissue when measuring.

In the case of this imaging technique, in which a body array coil and a local antenna that can be inserted into the body are used for simultaneously receiving the magnetic resonance signals, the individual pixels of the magnetic resonance image are composed of signal amplitudes that have been received by coil elements of the body array coil and signal amplitudes that have been received by the local antenna. The strong difference in the signal-to-noise ratio between the two antenna systems leads to problems, however, in representing the image.

In order to achieve a maximum signal-to-noise ratio, the signal amplitudes of the individual coil elements of the antennas are combined as a rule using the following algorithm to obtain the intensity or brightness value G of a pixel:

$$G = \sqrt{|E|^2 + |B_1|^2 + |B_2|^2 + \ldots + |B_n|^2},$$

$B_e$ denoting the signal amplitude received by the e-th element of the body array coil, and E denoting the signal amplitude received by the coil element of the local antenna. Calculating the individual pixels by means of this algorithm yields the best achievable signal-to-noise ratio, and the background noise is constant over the entire magnetic resonance image. The sensitivity profile or the sensitivity distribution of this combined magnetic resonance image is, however, very inhomogeneous, because of the strong difference between the signal-to-noise ratios of the body array coil and the local antenna. This inhomogeneity can have a disturbing effect in particular in the case of image viewing.

In order to homogenize such a combined magnetic resonance image, conventionally an additional damping of the received signals has been produced by mismatching of the endorectal coil. Although this damping can reduce the difference in intensity between the signal amplitudes of the endorectal coil and body array coil, the high signal-to-noise ratio of the endorectal coil is reduced in the process.

German PS 195 26 778, corresponding to U.S. Pat. No. 5,712,567, discloses a method for compensating the sensitivity profile of an antenna arrangement that is visible in a magnetic resonance image, the method using two or more coil elements located opposite one another. The region of the object that is to be examined is located between the coil elements situated opposite one another. A magnetic resonance image of the same object region is picked up with the two coil elements or groups of coil elements in each case. By forming the average value from the intensity or brightness values of mutually corresponding pixels in the two magnetic resonance images, a geometrically averaged magnetic resonance image is formed, and a noise-reduced intermediate image is formed by combination. The noise-reduced intermediate image is corrected by means of a reception profile calculated from the averaged and the noise-reduced image, in order to obtain a homogeneous magnetic resonance image. Such a technique can be used, for example, to compensate the sensitivity distribution of a body array coil, but does not solve the problem of the different sensitivity distributions of the body array coil and local antenna that is able to be inserted into the body.

SUMMARY OF THE INVENTION

An object of the present invention is to provide a method for homogenizing the imaging produced by a magnetic resonance measurement, wherein the image is composed of respective signal amplitudes from a local antenna of small dimensions and from an antenna arrangement, arranged outside the body, with larger dimensions than the local antenna. The method is intended not to entail any reduction in the signal-to-noise ratio of the local antenna.

The above object is achieved in accordance with the principles of the present invention in a method for homogenizing the imaging produced by a magnetic resonance measurement of a body region, wherein a local antenna of small dimensions and an antenna arrangement arranged outside of the body and having larger dimensions than the local antenna are used for imaging, to produce a combined image having pixels that are formed from first signals amplitudes received from coil elements of the antenna arrangement and second signal amplitudes received from the local antenna, wherein a reference image that is as homogenous as possible is formed from the first signal amplitudes, wherein the second signal amplitudes are, for each pixel, referenced to intensity values corresponding to the same pixels in the reference image, to obtain a reception profile referenced to the reference image for the local antenna, and wherein the noise in the reception profile is reduced by a processing step for noise suppression, and wherein the combined image is normalized to the reception profile to obtain a homogenized image.

The present invention is therefore used in the case of imaging in magnetic resonance tomography, wherein a local antenna of small dimensions, in particular a coil that can be inserted into the body such as, for example, an endorectal coil, and an antenna arrangement, arranged outside the body, of larger dimensions, in particular a body array coil, are switched simultaneously to reception for the purpose of imaging such that first signal amplitudes are received by coil elements of the outer antenna arrangement, and second signal amplitudes are received by the coil element or elements of the local antenna. The brightness or intensity values for the pixels of a combined magnetic resonance image are calculated from the received signal amplitudes of the two antenna systems.

The present invention is distinguished, by a reference image that is as homogeneous as possible being formed from the first signal amplitudes of the coil elements of the antenna arrangement arranged outside the body, also denoted below as the outer antenna arrangement. The intensity values obtained from the second signal amplitudes of the local antenna are referenced for each pixel to intensity values, corresponding to the same pixels, of the reference image (such as by dividing) in order to obtain a reception profile, referred to the reference image, of the local antenna, which profile is composed, in turn, from a number, corresponding to the number of pixels, of intensity values, and has its noise reduced by one or more processing steps for noise suppression. In this case, a reception profile that is not noise-reduced is preferably first formed and then subsequently subjected to the processing steps for noise suppression, preferably a low-pass filtering for suppressing noise of higher frequency. Of course, other techniques such as curve fitting or curve smoothing, for example, can be carried out as processing steps for noise suppression. Subsequently, the combined image formed from first signal amplitudes of coil elements of the outer antenna arrangement and second signal amplitudes of the local antenna is normalized for the noise-reduced reception profile. A homogenized magnetic resonance image is obtained as a result, that has an intensity or sensitivity distribution like a magnetic resonance image picked up solely with the outer antenna arrangement, but exhibits a clearly better signal-to-noise ratio in the spatial measuring range of the local antenna.

It is therefore possible with the present method to achieve clearly improved image recordings with applications in which a small spatial region in the interior of the object under examination is detected using a local antenna, in particular inserted into the body, of small dimensions or of small diameter at the same time as a relatively large region is detected with a surface or whole-body antenna, in order to obtain an image combined from the two measurements. In a preferred application with the use of an endorectal coil as the local antenna in prostate examinations, this leads to an intensity profile that is homogeneous over the entire image region, the clearly improved signal-to-noise ratio of the endorectal coil being maintained in the image region of the prostate on the basis of the measured values of this coil.

In the preferred application of the present method, the imaging is carried out using a body array coil as outer antenna arrangement.

The combined image preferably is formed by calculating the root of the sum of the squares of the signal amplitude or intensity values, belonging to each pixel, of the coil elements of the body array coil and the local antenna. The maximum achievable signal-to-noise ratio is reached in the combined image by this method of calculation. In the same way, the reference image formed from the signal amplitudes of the coil elements of the body array coil preferably is produced by virtue of the fact that each pixel of this reference image is calculated by calculating the root of the sum of the squares of the signal amplitudes belonging to each pixel.

The homogenized image is obtained in the last method step, preferably by a computing step in which for each pixel the intensity value of the combined image is divided by the value $\sqrt{1+|P_{ENDO}|^2}$, $P_{ENDO}$ corresponding to the intensity value of a pixel of the low-pass-filtered reception profile.

The image recordings or images to which the present method refers correspond to the body sections or sectional images that are conventionally picked up in magnetic resonance tomography and are composed of a matrix of pixels, for example 256×256 corresponding to 256 rows and 256 columns. Each pixel is represented in the displayed image by a brightness or intensity value that is calculated from the signal amplitudes which are received from the location of the object under examination that is assigned to the pixel. In the case of the combined image and the reference image, the signal amplitudes that are received by different coil elements from the same location are combined in a suitable way in order to obtain the corresponding pixel. The reception profile, calculated using the present invention, of the local antenna also can be displayed as an image in this case. As used herein, however, the term "image" does not necessarily mean an image that is displayed in some form so that it is visible to the eye. Rather, it suffices to obtain a data record with the number, corresponding to the pixels, of brightness or intensity values from which such an image can be optically displayed at remote times and locations. This relates, in particular, to the formation of the reference image, the reception profile, the low-pass-filtered reception profile and the combined image, which are only calculated as a rule in the case of the present invention, but not optically displayed. The values of the individual pixels are denoted in the present patent application as intensity or brightness values, since they are combined with the brightness of the corresponding pixel in the case of optical display of the image.

Since in the preferred embodiment the reception profile of the local antenna is calculated in the present method in relation to the body array coil, and the combined magnetic resonance image is corrected with the aid of this reception profile, the homogenized magnetic resonance image obtained using the method still has an inhomogeneity, resulting from the body array coil, in sensitivity over the examination region. In an embodiment of the present method, this resulting sensitivity profile is compensated by a method such as is described in the aforementioned U.S. Pat. No. 5,712,567, whose disclosure relating to the compensation of the sensitivity profile of one of a plurality of coil elements or individual antennas distributed around the object under investigation is incorporated herein by reference. The body array coil used in the imaging of the present method has a number of coil elements arranged around the object under examination. Given a suitable arrangement of these coil elements, it is possible to implement two coil elements or groups of coil elements, lying opposite one another, in accordance with U.S. Pat. No. 5,712,567, with which the geometric averaging, proposed in this publication for compensating the sensitivity profile, also can be carried out in the context of the present method. In this case, the present homogenized magnetic resonance image is normalized to a reception profile of the body array coil. As in U.S. Pat. No. 5,712,567, this reception profile is calculated by comparing the reference image with a compensated intermediate image. The compensated intermediate image is obtained by virtue of the fact that a magnetic resonance image is formed from the received signal amplitudes of each of the two coil elements lying opposite one another, or each of the two groups of coil elements lying opposite one another, and the average value of the intensity or brightness values of mutually corresponding pixels of the two magnetic resonance images is formed.

DESCRIPTION OF THE PREFERRED EMBODIMENTS

Figure 1:
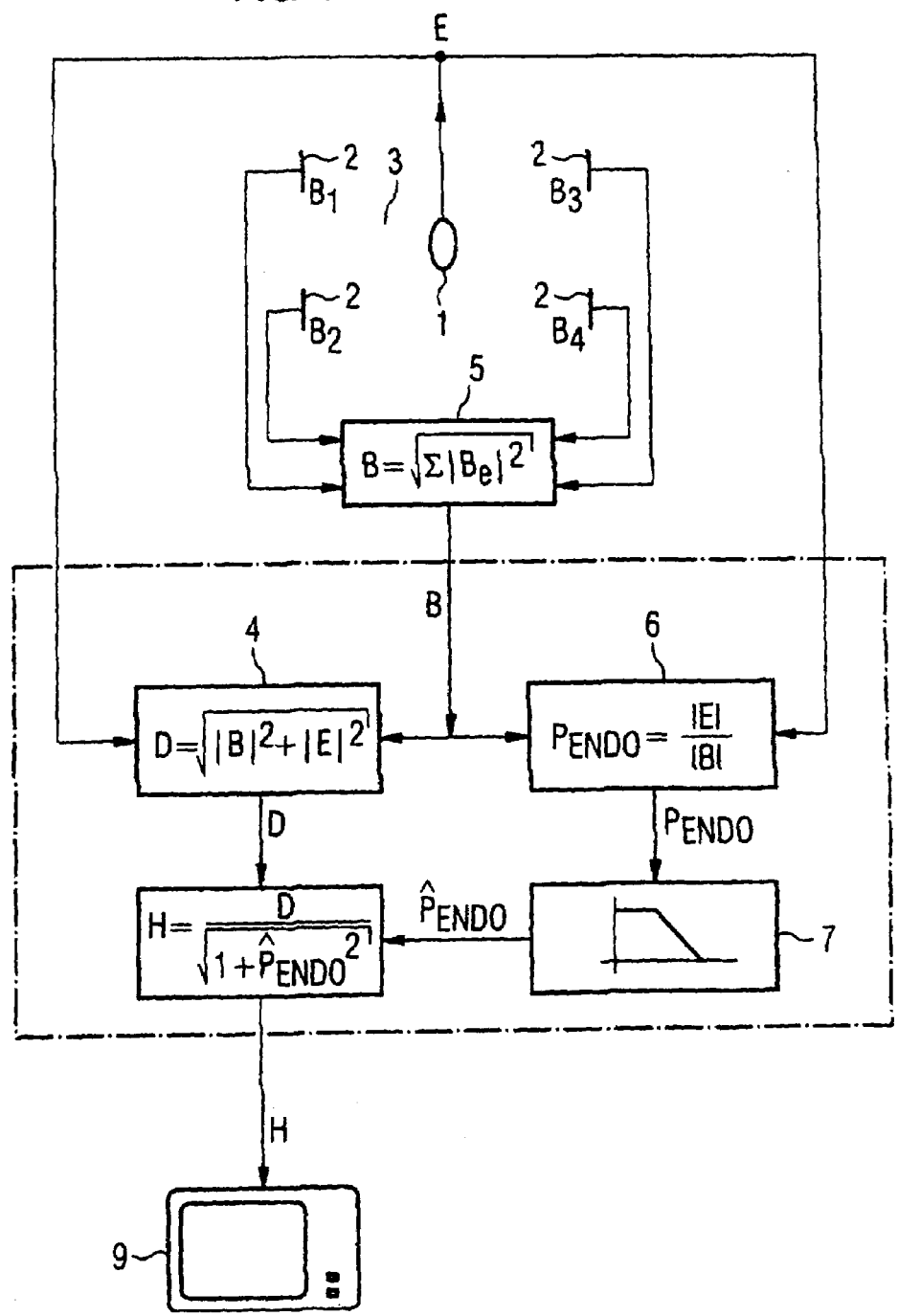
FIG. 1 shows the basic steps of the present method, in a schematic fashion with the aid of an exemplary embodiment.

FIG. 1 shows, as an example, a schematic of the basic method steps for carrying out the present invention. In this embodiment, the coil elements 2 of a body array coil, are arranged around an examination space 3 in which the object under examination (not illustrated), that is to say the patient to be examined, is located. Four coil elements 2 are illustrated in the present example, however, it is also possible to use only two or more of these coil elements 2 in the magnetic resonance tomography apparatus. Those skilled in the art are aware of the precise design of such body array coils. Also illustrated in FIG. 1 is an endorectal coil 1 that is positioned in the region of the patient's prostate, in order to receive locally there magnetic resonance signals with a high signal-to-noise ratio.

During imaging, in the present method, magnetic resonance signals are excited in the object region to be examined by radiating with radio-frequency transmitted pulses which are simultaneously received by the coil elements 2 of the body array coil and the coil element of the endorectal coil 1. Suitable excitation sequences are known to those skilled in the art. In the method sequence illustrated here by example, the signal amplitudes or measured values $B_e$, E of all the coil elements 1, 2 are combined in step 4 to form a combined image data record D. This is performed in the present example by forming the root of the sum of the squares of the measured values, corresponding to each pixel, of the individual coil elements, in order to reach a maximum achievable signal-to-noise ratio. The individual pixels D (i, j) of the combined image D are arranged in an known way in a rectangular matrix having M rows and N columns, i specifying the row number and j the column number. Consequently, the following calculation is carried out for each pixel (i, j):

$$D(i,j) = \sqrt{|B_1(i,j)|^2 + |B_2(i,j)|^2 + |B_3(i,j)|^2 + |B_4(i,j)|^2 + |E(i,j)|^2},$$

with $1 \leq i \leq M$ and $1 \leq j \leq N$. M=N=256 in the exemplary embodiment.

Because of the large difference in the signal-to-noise ratio between the measured values of the body array coil 2 and the endorectal coil 1, the combined image D that was calculated in step 4 is very inhomogeneous. In the case of the inventive method, this image D is present as a rule only as an image data record and is not illustrated.

Furthermore, the measured values of all the coil elements 2 of the body array coil for a maximum signal-to-noise ratio are combined in step 5 in order to obtain a reference image B. In the present example, this is carried out, in turn, by forming the root of the sum of the squares of the measured signal amplitudes $B_e$ (here e=1 . . . 4) of the individual coil elements 2 of the body array coil, in order to achieve a high signal-to-noise ratio. The individual pixels B (i, j) are obtained in this case from $$B(i,j) = \sqrt{|B_1(i,j)|^2 + |B_2(i,j)|^2 + |B_3(i,j)|^2 + |B_4(i,j)|^2},$$

Since no account has been taken of the endorectal coil 1 in forming this reference image B, the intensity profile contained in the image or image data record is relatively homogeneous.

In the next step 6, each pixel E (i, j) of the image or image data record picked up with the aid of the endorectal coil 1 is divided by the pixels B (i, j) of the reference image B such that the tissue contrast in the images is eliminated and the reception profile of the endorectal coil 1 relative to the reception or sensitivity profile $P_{ENDO}$ of the body array coil 2 is obtained, in which case $$P_{ENDO}(i,j) = \frac{|E(i,j)|}{|B(i,j)|}.$$

The profile $P_{ENDO}$ obtained by this calculation step is very noisy, owing to the poor signal-to-noise ratio of the body array coil 2. In a further step 7, this profile $P_{ENDO}$ is therefore subjected to a low-pass filtering in order to reduce the noise. The low-pass filter or filters are selected in such a way that as large as possible a noise fraction is filtered out, without falsifying the coil profile. This is possible because the coil profiles vary very slowly by comparison with the resolution of a magnetic resonance image. The filtered coil profile obtained by the low-pass filtering is denoted below as $\hat{P}_{ENDO}$.

Finally, the combined overall image D is normalized using this relative filtered coil profile $\hat{P}_{ENDO}$ of the endorectal coil 1. This normalization is performed in the present example by the calculation step 8:

$$H(i, j) = \frac{D(i, j)}{\sqrt{1 + |\hat{P}_{ENDO}(i, j)|^2}}$$

for all pixels (i, j). This homogenized image H has the intensity distribution of the body array image B, but exhibits the clearly improved signal-to-noise ratio of the endorectal coil in the vicinity of the measuring volume detected by the endorectal coil 1. The homogenized image H can then be displayed on a monitor 9.

Figure 2:
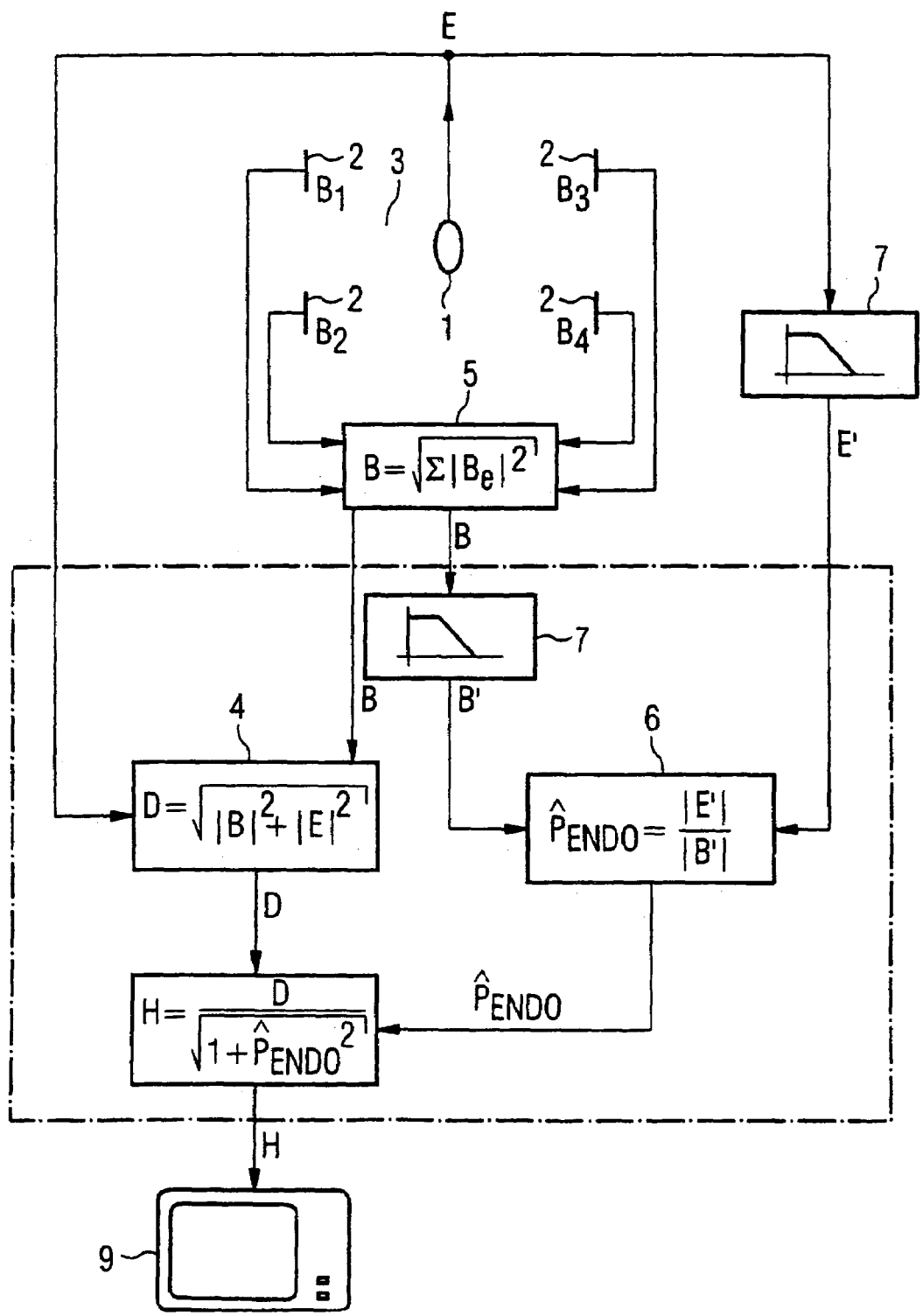
FIG. 2 shows an alternative embodiment of the method illustrated in FIG. 1.

FIG. 2 shows an alternative embodiment of the method of FIG. 1, in which substantially the same method steps are carried out as in the case of the method of FIG. 1. The difference is only that the low-pass filtering 7 is applied not to the reception profile $P_{ENDO}$, but already to the reference image B and the measured values of the endorectal coil 1. The further method steps therefore need not be explained again, since they have already been described in more detail in conjunction with FIG. 1. The same result is achieved with this low-pass filtering of the reference image B and of the measured values E of the endorectal coil 1 as in the case of a low-pass filtering of the reception profile $P_{ENDO}$.

Figure 3:
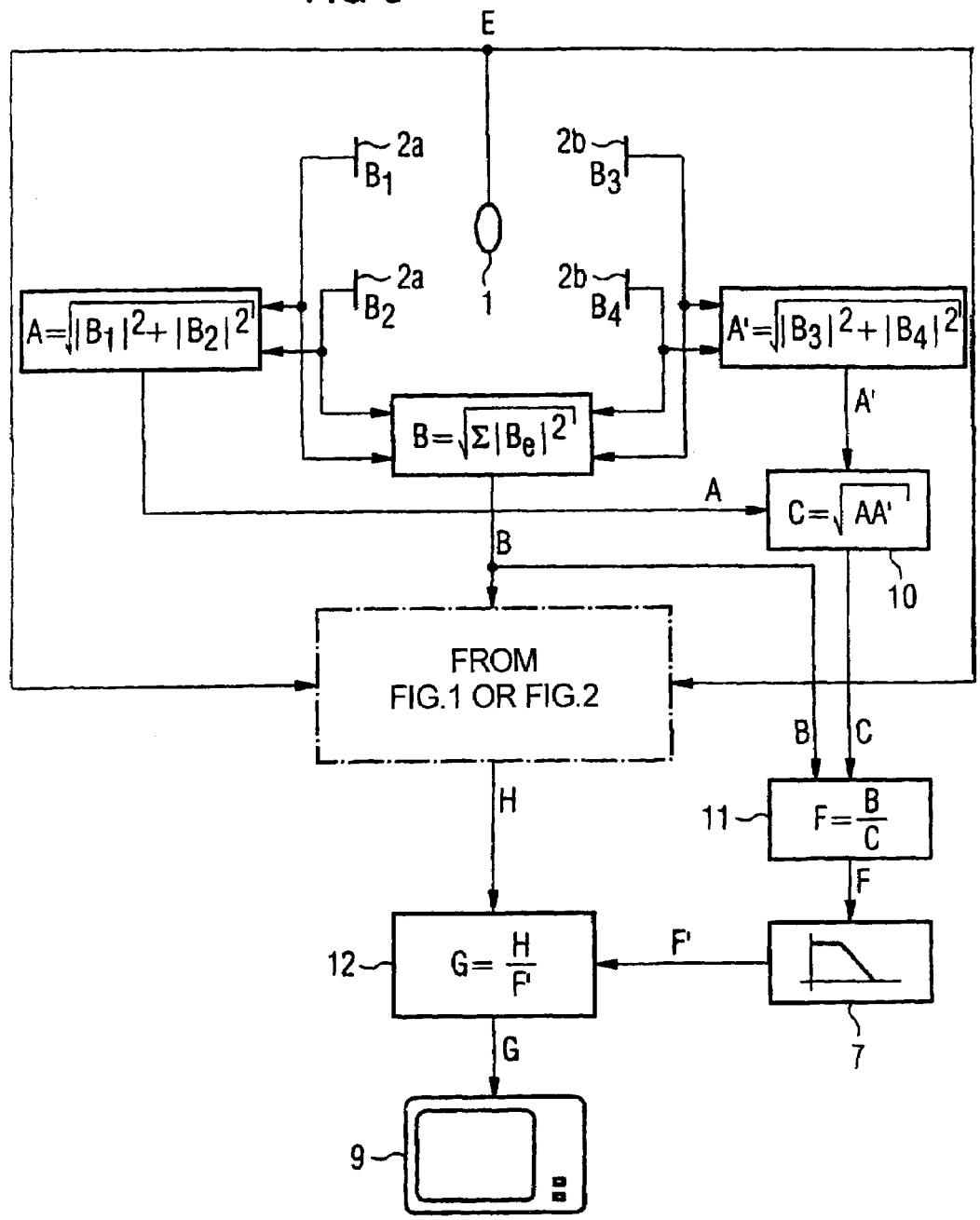
FIG. 3 shows a further embodiment of the present method.

Finally, FIG. 3 is a schematic of an extended embodiment of the present method. In this embodiment, the homogenized image H as obtained from the method steps of the exemplary embodiments of FIG. 1 or 2 is subjected to further method steps in order to compensate a remaining sensitivity distribution owing to the body array coil 2. The box illustrated by dots and dashes in FIG. 3 constitutes the method steps framed in dashes in FIG. 1 or 2.

In this embodiment, the coil elements 2 of the body array coil are split into two groups 2a and 2b lying opposite one another. The conduct of the method is performed in this case firstly in the same way as in the preceding exemplary embodiments, in order to obtain the homogenized image H. In addition, in this embodiment, however, the signal amplitudes $B_1$, $B_2$, which are received by the coil elements 2a located on one side of the object under examination, are combined to form a first partial image A. In the same way, a second partial image A' is produced from the signal amplitudes $B_3$, $B_4$ of the coil elements 2b lying opposite. An intermediate image C is then obtained from the two partial images A and A' by multiplying the values respectively corresponding to the same pixels and taking the root in the partial step 10, in which case $$C(i, j) = \sqrt{|A(i,j)| \cdot |A'(i,j)|}.$$

This intermediate image C, which corresponds to a compensated magnetic resonance image of the body array coil 2, now is used first to determine the sensitivity profile F of the body array coil 2 in step 11. Subsequently, a low-pass filtering 7 is carried out in order to obtain a noise-reduced sensitivity profile F'. The noise-reduced sensitivity profile F' is finally referred pixel for pixel in step 12 to the homogenized magnetic resonance image H, such that a compensated homogeneous magnetic resonance image G is obtained that can be displayed on a monitor 9.

Of course, it is also possible in the case of this embodiment to use the low-pass filtering at another suitable point, for example by direct application to the intermediate image C.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for homogenizing an image obtained by a magnetic resonance apparatus measurement of a body region, comprising the steps of:
   obtaining first signal amplitudes from coil elements of an antenna arrangement disposed outside of a body region from which said signal amplitudes originate;
   simultaneously obtaining second signal amplitudes from said body region with a local antenna having smaller dimensions than said antenna arrangement, said first and second signal amplitudes respectively representing a plurality of pixels;
   forming a homogenous reference image from said first signal amplitudes;
   for each pixel, referencing said second signal amplitudes to intensity values for the same pixels in said reference image, to obtain a reception profile referenced to said reference image for said local antenna, said reception profile containing noise;
   reducing said noise in said reception profile by noise suppression processing; and
   combining said first and second signal amplitudes to form a combined image and normalizing said combined image to said reception profile to obtain a homogenized image.

2. A method as claimed in claim 1 comprising forming said combined image by calculating a root of the sum of the squares, for each pixel, of said first signal amplitudes and said second signal amplitudes.

3. A method as claimed in claim 1 comprising forming said reference image by calculating the root of the sum, for each pixel, of the squares of the second signal amplitudes.

4. A method as claimed in claim 1 comprising obtaining said homogenized image by calculating, for each pixel, $$H = \frac{D}{\sqrt{1 + |\hat{P}_{ENDO}|^2}},$$

wherein H is the intensity value of a pixel in the homogenized image, D is the intensity value of a pixel in the combined image, and $\hat{P}_{ENDO}$ is the intensity value of a pixel of said reception profile after said noise suppression processing.

5. A method as claimed in claim 1 comprising the additional step of normalizing said homogenized image to a sensitivity profile of said antenna arrangement to obtain a homogenized image with compensated sensitivity.

6. A method as claimed in claim 5 comprising situating said coil elements of said antenna arrangement at opposite sides of said body, and comprising the additional steps:
   obtaining an intermediate image by forming an average value of respective intensity values of corresponding pixels in two magnetic resonance images of said body formed from respective signal amplitudes from said coil elements at said opposite sides of said body; and
   calculating said sensitivity profile of said antenna arrangement by comparing said intermediate image with said reference image.

7. A method as claimed in claim 1 comprising including low-pass filtering in said noise suppression processing.

8. A method as claimed in claim 1 comprising employing an endorectal coil for prostate examination as said local coil, and employing a body array coil as said antenna arrangement disposed outside of said body.

* * * * *